(12) United States Patent
Sun et al.

(10) Patent No.: US 10,153,154 B2
(45) Date of Patent: Dec. 11, 2018

(54) PROCESS OF PREPARING LOW DIELECTRIC CONSTANT THIN FILM LAYER USED IN INTEGRATED CIRCUIT

(71) Applicant: SOOCHOW UNIVERSITY, Suzhou, Jiangsu (CN)

(72) Inventors: Xuhui Sun, Suzhou (CN); Yujian Xia, Suzhou (CN)

(73) Assignee: SOOCHOW UNIVERSITY, Suzhou (CN)

( * ) Notice: Subject to any disclaimer, the term of this patent is extended or adjusted under 35 U.S.C. 154(b) by 109 days.

(21) Appl. No.: 15/303,380

(22) PCT Filed: Jun. 23, 2014

(86) PCT No.: PCT/CN2014/080502
§ 371 (c)(1),
(2) Date: Nov. 25, 2016

(87) PCT Pub. No.: WO2015/154337
PCT Pub. Date: Oct. 15, 2015

(65) Prior Publication Data
US 2017/0069489 A1    Mar. 9, 2017

(30) Foreign Application Priority Data
Apr. 8, 2014 (CN) .......................... 2014 1 0136480

(51) Int. Cl.
*H01L 21/02*      (2006.01)
*H01L 21/768*     (2006.01)
(Continued)

(52) U.S. Cl.
CPC ........ *H01L 21/02274* (2013.01); *C23C 16/30* (2013.01); *C23C 16/4482* (2013.01);
(Continued)

(58) Field of Classification Search
CPC ....... C23C 16/00; H01J 37/00; H01J 2237/00; H01L 21/00
See application file for complete search history.

(56) References Cited

U.S. PATENT DOCUMENTS 4,223,048 A * 9/1980 Engle, Jr. .............. C23C 16/509
117/103
2010/0052114 A1 * 3/2010 Hara ........................ C07F 7/21
257/632

* cited by examiner

*Primary Examiner* — David P Turocy
*Assistant Examiner* — Mohammad Mayy
(74) *Attorney, Agent, or Firm* — Oliff PLC

(57) ABSTRACT

Preparing a low dielectric constant thin film layer used in an integrated circuit includes: extracting gas out of a furnace; when the vacuum level within the furnace is less than $10^{-3}$ Pa, starting a 13.36 MHz radio frequency power supply and a matcher; sending the exhaust nitrogen gas, used to remove remaining gas out of the furnace by a third gas inlet pipe, into the furnace through a second pressure gas mixing tank and a second nozzle sequentially; uniformly mixing octamethyl cyclotetrasiloxane and cyclohexane, and introducing same into a pressure stainless steel tank, and, respectively by first and second gas inlet tubes, introducing bubbled nitrogen gas and inert gas into the furnace sequentially through a first pressure gas mixing tank, the pressure stainless steel tank and a first nozzle; after deposition, transferring the deposited thin film layer to the furnace's heating zone for annealing, obtaining a low dielectric constant thin film layer.

7 Claims, 1 Drawing Sheet

(51) Int. Cl.
  *C23C 16/50* (2006.01)
  *H01J 37/32* (2006.01)
  *C23C 16/30* (2006.01)
  *C23C 16/448* (2006.01)
  *C23C 16/507* (2006.01)
  *C23C 16/56* (2006.01)

(52) U.S. Cl.
  CPC ............ *C23C 16/50* (2013.01); *C23C 16/507* (2013.01); *C23C 16/56* (2013.01); *H01J 37/321* (2013.01); *H01J 37/32449* (2013.01); *H01L 21/02216* (2013.01); *H01L 21/768* (2013.01); *H01L 21/76829* (2013.01); *H01J 2237/3321* (2013.01)

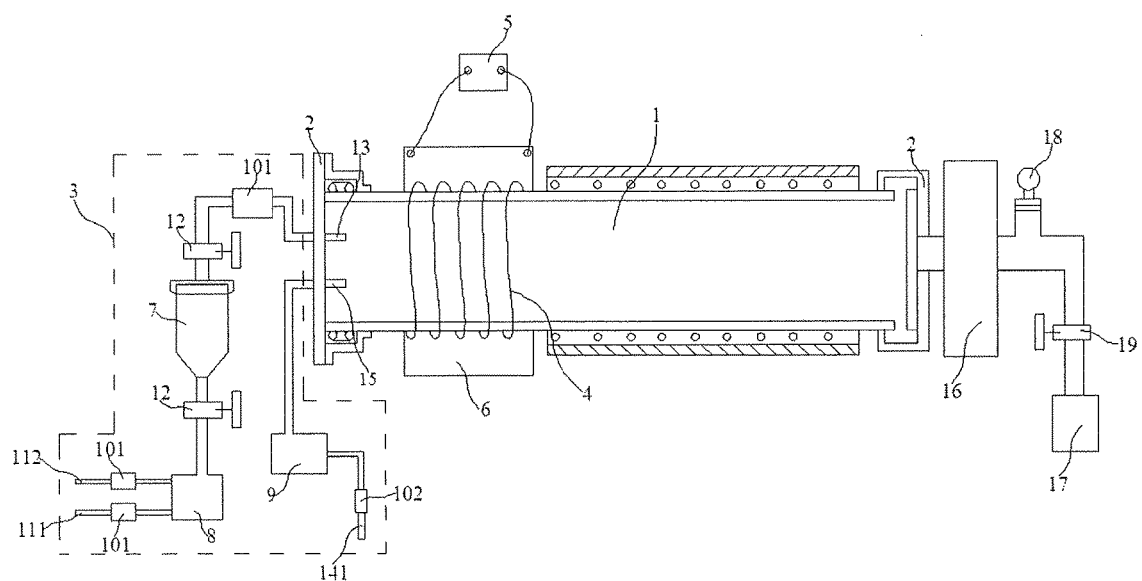

PROCESS OF PREPARING LOW DIELECTRIC CONSTANT THIN FILM LAYER USED IN INTEGRATED CIRCUIT

TECHNICAL FIELD

The present invention relates to a process of preparing low dielectric constant thin film layer used in integrated circuit, which is included in the semi-conductor technical field.

BACKGROUND OF INVENTION

Inside the integrated circuit, all components are mainly connected with the metallic conductors. With the development of integrated circuit technology, the density of interconnected lines in the chips is increasing, and the width and spacing between the interconnected lines are decreasing, so the parasitic effect generated from interconnection resistance (R) and capacitance (C) is becoming more and more obvious. In order to reduce the delay of interconnection RC and improve the chip performance, the material with low dielectric constant (k) is continuously presented and adopted to become the main development trend.

The method to prepare the low dielectric constant thin film layer includes the plasma enhanced chemical vapor deposition (PECVD) and spin-coating. And the PECVD has the features of even thin film and low cost, so it's widely applied in the semi-conductor industry.

Among the materials used to prepare the low dielectric constant, the organosilane or organosilicone has the simple chemical synthesis and low cost and its storage and transportation is easier in relation to the gas, so it's widely used as the liquid source to prepare the low dielectric constant material and the chemical composition of the thin film material prepared from this liquid source could be simply expressed as SiCOH and the siloxane bond between the molecules form the large scale of cage structure. It's very difficult to use the common single liquid source to control its dielectric constant value conveniently and precisely and it's difficult to synthesize the liquid source with high C/Si ratio, so it's difficult to make the large-scale production.

DISCLOSURE OF THE INVENTION

The purpose of present invention is to provide a process of preparing low dielectric constant thin film layer used in integrated circuit and the preparation process realizes the convenient and precise control of dielectric constant values for thin film and obtains low dielectric constant thin film layer. The thin film layer has more uniform chemical ingredients, excellent thermal stability and hardness, and the process improves smoothness of the thin film.

In order to achieve the above purpose, the technical plan applied by the present invention is: a process of preparing the low dielectric constant thin film layer used in the integrated circuit and the preparation method is based on a deposition device, which comprises a furnace installed with end caps at two ends, a liquid source injection mechanism at one side of furnace, the front half section of the furnace is wrapped with an induction coil and the induction coil is sequentially connected to a 13.36 MHz radio frequency power supply and a matcher, and the liquid source injection mechanism comprises a pressure stainless steel tank, a first pressure gas mixing tank and a second pressure gas mixing tank and the first pressure gas mixing tank is connected with a first gas inlet tube and a second gas inlet tube installed with a first mass flowmeter at one end, and the first pressure gas mixing tank is connected with one end of the pressure stainless steel tank through the pipe installed with a thimble valve at the other end, the other end of pressure stainless steel tank is connected to the first nozzle through the pipe installed with thimble valve and first mass flowmeter; the second pressure gas mixing tank is connected with a third gas inlet pipe installed with a second mass flowmeter at one end and the second pressure gas mixing tank is connected to a second nozzle at the other end, and the first nozzle and the second nozzle are hermetically inserted into the end cap at one end of furnace to be inserted into the furnace;

a vacuum pump is located at the other side of furnace and the pipe connecting one end of the vacuum pump is hermetically inserted into the end cap at the other end of the furnace and a manual flapper valve and vacuometer are installed in the pipe between the end cap and vacuum pump;

it includes the following steps:

Step 1: after closing the thimble valve and first and second mass flowmeter, open the manual flapper valve and vacuum pump to extract the gas out of the furnace;

Step 2: when the vacuum level within the furnace is less than 10−3 Pa, starting a 13.36 MHz radio frequency power supply and a matcher;

Step 3: after opening the second mass flowmeter, send the exhaust nitrogen gas, used to remove the remaining gas out of the furnace by a third gas inlet pipe, into the furnace through a second pressure gas mixing tank and a second nozzle sequentially;

Step 4: uniformly mix octamethyl cyclotetrasiloxane and cyclohexane, and introducing same into the said pressure stainless steel tank, and, respectively by a first gas inlet tube and a second gas inlet tube, introducing bubbled nitrogen gas and inert gas into the furnace sequentially through a first pressure gas mixing tank, the pressure stainless steel tank and a first nozzle; so that the octamethyl cyclotetrasiloxane and cyclohexane are introduced into the furnace and the octamethyl cyclotetrasiloxane, cyclohexane and the bubbled gas form a thin film layer on the base surface under the plasma condition;

Step 5; after the deposition, close the 13.36 MHz radio frequency power supply, matcher, thimble valve, first and second mass flowmeter before closing the manual flapper valve and remove the gas out of the furnace, and after the pressure inside the furnace returns to the atmospheric pressure, open the end cap at one side of vacuum pump and transfer the deposited thin film layer to the heating zone of furnace and close the end cap, then open the manual flapper valve for vacuum pumping, when the vacuum level within the furnace is less than 10−3 Pa, transfer the deposited thin film layer to the heating zone of furnace and heat to 300☐~800☐ for the heat preservation and annealing to obtaining the said low dielectric constant thin film layer with the annealing condition of vacuum gas-free protection.

The further improvement solution of the said technical solution is as follows:

1. In above described technical solution, a tail gas purifier is installed between a end cap and a vacuum pump.

2. In above described technical solution, the flow rate of the said bubbled gas in Step 4 is 0.1 sccm~1000 sccm.

3. In above described technical solution, the said bubbled gas in Step 4 is bubbled nitrogen gas or inert gas, which could be one of the argon gas, helium gas and neon.

4. In above described technical solution, the power of the 13.36 MHz radio frequency power supply and matcher in Step 5 is 25 W~300 W and the deposition time is 30 seconds 1 hour.

5. In above described technical solution, the flow rate of the exhaust nitrogen gas or inert gas in Step 3 is 2~5 sccm and the gassing time is 10 minutes.

Due to the application of the above described technical solution, the present invention has the following advantages and effect in comparison with the prior art:

The process of preparing the low dielectric constant thin film layer used in the integrated circuit in the present invention realizes the convenient and precise control of dielectric constant values for thin film and obtains low dielectric constant thin film layer. The thin film layer has more uniform chemical ingredients, excellent thermal stability and hardness, and the process improves smoothness of the thin film; and the deposited thin film layer is heated to 300□~800□ for heat preservation and annealing with the annealing condition of vacuum gas-free protection, so it excludes the influence of atmosphere to obviously improve the repeatability of sample in comparison to the annealing in the atmosphere and it's easy to be controlled, and the sample is not blown away as the protection gas is not introduced, and the gas around the sample is even as it avoids the turbulence on the sample surface; and the sample surface temperature is closer to the set temperature, so it gets the better uniformity and reliability.

BRIEF DESCRIPTION OF THE DRAWINGS

FIG. 1 shows the structure of the deposition device used in the preparation method in the present invention.

In the above figures: 1. furnace; 2. end cap; 3. liquid source injection mechanism; 4. induction coil; 5. 13.36 MHz radio frequency power supply; 6. matcher; 7. pressure stainless steel tank; 8. first pressure gas mixing tank; 9. second pressure gas mixing tank; 101. first mass flowmeter; 102. second mass flowmeter; 111. first gas inlet tube; 112. second gas inlet tube; 12. thimble valve; 13. first nozzle; 141. third gas inlet pipe; 15. second nozzle; 16. tail gas purifier; 17. vacuum pump; 18. vacuometer; 19. manual flapper valve

SPECIFIC EMBODIMENT

With reference to the embodiments, the present invention will be described in detail: Embodiment 1~3: a process of preparing the low dielectric constant thin film layer used in the integrated circuit and the preparation method is based on a deposition device, which comprises a furnace 1 installed with end caps 2 at two ends, a liquid source injection mechanism 3 at one side of furnace 1, the front half section of the furnace 1 is wrapped with an induction coil 4 and the induction coil 4 is sequentially connected to a 13.36 MHz radio frequency power supply 5 and a matcher 6, and the liquid source injection mechanism 3 comprises a pressure stainless steel tank 7, a first pressure gas mixing tank 8 and a second pressure gas mixing tank 9 and the first pressure gas mixing tank 8 is connected with a first gas inlet tube 111 and a second gas inlet tube 112 installed with a first mass flowmeter 101 at one end, and the first pressure gas mixing tank 8 is connected with one end of the pressure stainless steel tank 7 through the pipe installed with a thimble valve 12 at the other end, the other end of pressure stainless steel tank 7 is connected to the first nozzle 13 through the pipe installed with thimble valve 12 and first mass flowmeter 101; the second pressure gas mixing tank 9 is connected with a third gas inlet pipe 141 installed with a second mass flowmeter 102 at one end and the second pressure gas mixing tank 9 is connected to a second nozzle 15 at the other end, and the first nozzle 13 and the second nozzle 15 are hermetically inserted into the end cap at one end of furnace to be inserted into the furnace;

a vacuum pump 17 is located at the other side of furnace 1 and the pipe connecting one end of the vacuum pump 17 is hermetically inserted into the end cap 2 at the other end of the furnace 1 and a manual flapper valve 19 and vacuometer 18 are installed in the pipe between the end cap 2 and vacuum pump 17;

it includes the following steps:

Step 1: after closing the thimble valve 12 and first and second mass flowmeter 101, 102, open the manual flapper valve 19 and vacuum pump 17 to extract the gas out of the furnace;

Step 2: when the vacuum level within the furnace is less than $10^{-3}$ Pa, starting a 13.36 MHz radio frequency power supply 5 and a matcher 6;

Step 3: after opening the second mass flowmeter 102, send the exhaust nitrogen gas, used to remove the remaining gas out of the furnace by a third gas inlet pipe 141, into the furnace 1 through a second pressure gas mixing tank 9 and a second nozzle 15 sequentially; the gas is not turned off in the next process and the flow rate is regulated as required:

Step 4: uniformly mix octamethyl cyclotetrasiloxane and cyclohexane, and introducing same into the said pressure stainless steel tank 7, and, respectively by a first gas inlet tube 111 and a second gas inlet tube 112, introducing bubbled nitrogen gas and inert gas into the furnace 1 sequentially through a first pressure gas mixing tank 8, the pressure stainless steel tank 7 and a first nozzle 13; so that the octamethyl cyclotetrasiloxane and cyclohexane are introduced into the furnace 1 and the octamethyl cyclotetrasiloxane, cyclohexane and the bubbled gas form a thin film layer on the base surface under the plasma condition;

Step 5: after the deposition, close the 13.36 MHz radio frequency power supply 5, matcher 6, thimble valve 12, first and second mass flowmeter 101, 102 before closing the manual flapper valve 19 and remove the gas out of the furnace, and after the pressure inside the furnace 1 returns to the atmospheric pressure, open the end cap at one side of vacuum pump 17 and transfer the deposited thin film layer to the heating zone of furnace and close the end cap, then open the manual flapper valve for vacuum pumping, when the vacuum level within the furnace is less than $10^{-3}$ Pa, transfer the deposited thin film layer to the heating zone of furnace 1 and heat to 300□~800□ for the heat preservation and annealing to obtaining the said low dielectric constant thin film layer with the annealing condition of vacuum gas-free protection.

A tail gas purifier 16 is installed between a end cap 2 and a vacuum pump 17.

The flow rate of the said bubbled gas in Step 4 is 0.1 sccm~1000 sccm.

The said bubbled gas in Step 4 is bubbled nitrogen gas or inert gas, which could be one of the argon gas, helium gas and neon.

The power of the 13.36 MHz radio frequency power supply 5 and matcher 6 in Step 5 is 25 W~300 W and the deposition time is 30 seconds~1 hour.

The flow rate of the exhaust nitrogen gas or inert gas in Step 3 is 2~5 sccm and the gassing time is 10 minutes.

Embodiment 1:

| | | |
|---|---|---|
| Liquid source | Composition and volume ratio percentage | |
| | octamethyl cyclotetrasiloxane | cyclohexane |
| | 50% | 50% |
| bubbled gas | Composition and rate of volume flow | |
| | nitrogen gas | |
| | 10 sccm | |
| diluent gas | Composition and rate of volume flow | |
| | nitrogen gas | |
| | 50 sccm | |
| radio frequency power supply | power of radio frequency power supply | deposition time |
| | 100 W | 10 minutes |
| annealing | annealing temperature | annealing time |
| | 400° C. | 60 minutes |
| dielectric constant | 2.1 | |

Embodiment 2:

| | | |
|---|---|---|
| Liquid source | Composition and volume ratio percentage | |
| | octamethyl cyclotetrasiloxane | cyclohexane |
| | 50% | 50% |
| bubbled gas | Composition and rate of volume flow | |
| | nitrogen gas | |
| | 10 sccm | |
| diluent gas | Composition and rate of volume flow | |
| | nitrogen gas | |
| | 50 sccm | |
| radio frequency power supply | power of radio frequency power supply | deposition time |
| | 100 W | 10 minutes |
| annealing | annealing temperature | annealing time |
| | 400° C. | 120 minutes |
| dielectric constant | 2.4 | |

Embodiment 3:

| | | |
|---|---|---|
| Liquid source | Composition and volume ratio percentage | |
| | octamethyl cyclotetrasiloxane | cyclohexane |
| | 50% | 50% |
| bubbled gas | Composition and rate of volume flow | |
| | nitrogen gas | |
| | 10 sccm | |
| diluent gas | Composition and rate of volume flow | |
| | nitrogen gas | |
| | 50 sccm | |
| radio frequency power supply | power of radio frequency power supply | deposition time |
| | 100 W | 10 minutes |
| annealing | annealing temperature | annealing time |
| | 500° C. | 60 minutes |

It should be noted that the above described embodiments are only for illustration of technical concept and characteristics of present invention with purpose of making those skilled in the art understand the present invention, and thus these embodiments shall not limit the protection range of present invention. The equivalent changes or modifications according to spiritual essence of present invention shall fall in the protection scope of present invention.

The invention claimed is:

1. A process of preparing a low dielectric constant thin film layer for use in an integrated circuit, the process of preparing utilizing a deposition device comprising a furnace installed with an end cap at each end of the furnace, a front half section of the furnace being wrapped with an induction coil and the induction coil is sequentially connected to a 13.36 MHz radio frequency power supply and a matcher, a liquid source injection mechanism comprising a pressure tank, a first pressure gas mixing tank and a second pressure gas mixing tank wherein the first pressure gas mixing tank is connected with a first gas inlet tube and a second gas inlet tube each installed with a first mass flowmeter, and the first pressure gas mixing tank is further connected with the pressure tank through a pipe installed with a thimble valve, the pressure tank being further connected to a first nozzle through a pipe installed with a thimble valve and a further first mass flowmeter, wherein the second pressure gas mixing tank is connected with a third gas inlet tube having a second mass flowmeter and the second pressure gas mixing tank being further connected to a second nozzle, and wherein the first nozzle and the second nozzle are hermetically inserted into one of the end caps of the furnace at one end of furnace, and a vacuum pump, wherein the vacuum pump is connected to a pipe that is hermetically inserted into an other one of the end caps at an end of the furnace opposite to the one end of the furnace, and wherein a manual flapper valve and a vacuometer are installed in the pipe between the end cap and the vacuum pump;

wherein the process of preparing includes the following steps:

Step 1: after closing the thimble valve and the first mass flowmeter and the second mass flowmeter, opening the manual flapper valve and the vacuum pump to extract gas out of the furnace;

Step 2: when the vacuum level within the furnace is less than $10^{-3}$ Pa, starting the 13.36 MHz radio frequency power supply and the matcher;

Step 3: after opening the second mass flowmeter, sending exhaust nitrogen gas, used to remove remaining gas out of the furnace by a third gas inlet pipe, into the furnace through the second pressure gas mixing tank and the second nozzle sequentially;

Step 4: uniformly mixing octamethyl cyclotetrasiloxane and cyclohexane, and introducing same into the pressure tank, and, respectively by the first gas inlet tube and the second gas inlet tube, introducing bubbled gas and inert gas into the furnace through the first pressure gas mixing tank, the pressure tank and the first nozzle so that the octamethyl cyclotetrasiloxane, cyclohexane and the bubbled gas form a thin film layer on a base surface under a plasma condition;

Step 5: after the deposition, closing the 13.36 MHz radio frequency power supply, matcher, thimble valve, first mass flowmeter and second mass flowmeter before closing the manual flapper valve and removing the gas out of the furnace, and after the pressure inside the furnace returns to atmospheric pressure, opening the end cap at one side of the vacuum pump and transferring the deposited thin film layer to a heating zone of the furnace and closing the end cap, then opening the manual flapper valve for vacuum pumping, when the vacuum level within the furnace is less than $10^{-3}$ Pa, heating the transferred thin film layer to a temperature of from 300° C. to 800° C. for annealing under vacuum to obtain the low dielectric constant thin film layer.

2. The process of preparing the low dielectric constant thin film layer as claimed in claim 1, wherein a tail gas purifier is installed between the end cap and the vacuum pump.

3. The process of preparing the low dielectric constant thin film layer as claimed in claim 1, wherein a flow rate of the bubbled gas in Step 4 is from 0.1 sccm to 1000 sccm.

4. The process of preparing the low dielectric constant thin film layer as claimed in claim 1, wherein the bubbled gas in Step 4 is bubbled nitrogen gas and the inert gas is, one or more of argon gas, helium gas and neon.

5. The process of preparing the low dielectric constant thin film layer as claimed in claim 1, wherein a power of the 13.36 MHz radio frequency power supply and the matcher in Step 5 is from 25 W to 300 W and a deposition time is from 30 seconds to 1 hour.

6. The process of preparing the low dielectric constant thin film layer as claimed in claim 1, wherein a flow rate of the exhaust nitrogen gas in Step 3 is from 2 to 5 sccm and a gassing time is 10 minutes.

7. The process of preparing the low dielectric constant thin film layer as claimed in claim 1, wherein the pressure tank is a pressure stainless steel tank.

* * * * *